United States Patent [19]

Jay

[11] Patent Number: 4,563,696
[45] Date of Patent: Jan. 7, 1986

[54] BALLISTIC TRANSPORT-TYPE SEMICONDUCTOR DEVICE FOR DEFLECTING ELECTRONS

[75] Inventor: Paul R. Jay, Paris, France
[73] Assignee: Thomson-CSF, Paris, France
[21] Appl. No.: 340,965
[22] Filed: Jan. 20, 1982

[30] Foreign Application Priority Data

Jan. 27, 1981 [FR] France .................. 81 01466

[51] Int. Cl.⁴ ........................... H01L 29/76
[52] U.S. Cl. ...................... 357/22; 357/15; 357/58
[58] Field of Search .............. 357/22, 58, 15

[56] References Cited

U.S. PATENT DOCUMENTS

| | | | |
|---|---|---|---|
| 3,560,963 | 2/1971 | Trilling ........................... | 357/22 |
| 3,593,045 | 7/1971 | Bartelink et al. ............... | 357/15 |
| 4,129,880 | 12/1978 | Vinal ............................... | 357/27 |
| 4,254,430 | 3/1981 | Beneking ........................ | 357/22 |
| 4,366,493 | 12/1982 | Braslau et al. ................. | 357/22 |

OTHER PUBLICATIONS

IEEE Transactions on Electron Devices, vol. ED-27, No. 6, Jun. 1980, C. O. Bozler et al., "Fabrication and Numerical Simulation of the Permeable Base Transistor", pp. 1128–1141.

Primary Examiner—William D. Larkins
Assistant Examiner—E. Fallick
Attorney, Agent, or Firm—Roland Plottel

[57] ABSTRACT

A semiconductor device having a structure originating from field effect transistors of a vertical configuration type in which a deflection is brought about between the electrons so as to be able to switch in an ultra-rapid manner a current or signal, or produce a phase shift. In a very thin monocrystalline gallium arsenide film, a certain number of cells are produced for this purpose and each of them includes a cathode, a first gate electrode embedded in the semiconductor material, a second gate electrode and at least one anode electrode serving as a target for the ballistic electrons. The electron beam is deflected as a function of the different polarizations applied to the gate electrodes.

3 Claims, 16 Drawing Figures

BALLISTIC TRANSPORT-TYPE SEMICONDUCTOR DEVICE FOR DEFLECTING ELECTRONS

BACKGROUND OF THE INVENTION

The invention relates to a semiconductor device having a structure effect from that of field originating transistors of a vertical configuration, and with which it is proposed to induce by novel means a deflection of ballistic electrons in such a way as to bring about an extremely rapid switching of a current or signal, or a change in phase of the signal. The invention also relates to a production process for such a device.

It is known that under certain conditions, the electrons which are displaced under an electrical field effect in a semiconductor medium, such as gallium arsenide, indium phosphide or indium-antimonide can, over a distance less than one micron, take paths which are not disturbed in speed and direction by collisions with other particles. These are called ballistic electrons. The transit time of the electrons within the ballistic transport device must be approximately the same as the average relaxation time of an electron beam between incidents leading to a loss of energy through any random mechanism in the semiconductor material.

Vertical transistor structures have been produced in which electrons are channelled, between the fingers of a gate embedded in semiconductor material, and which very rapidly cross the very short distance between the cathode and anode, i.e. between the source and drain of the field effect transistor constituted by the structure. As a result of the partially ballistic behaviour of the electrons, such transistors have a higher maximum frequency and transconductance than conventional transistors. However, such structures cannot be used for performing certain high speed switching functions or for very accurate phase shifting.

BRIEF SUMMARY OF THE INVENTION

An object of the invention is to obviate the above disadvantages by modifying very considerably the structure of an embedded gate field effect transistor so as to permit the production of switches and phase shifters.

In the device according to the invention, the structure has at least one cathode and at least one anode, the said two electrodes being positioned on either side of a semiconductor film in such a way as to encourage the phenomenon of ballistic electrons, said film being a first embedded gate electrode.

The structure also comprises a second embedded gate electrode, means being provided for applying different voltages to the first and second gate electrodes and, as a function of whether it is a switch or a phase shifter, a supplementary anode electrode or an anode electrode of sufficient length to provide a transit time distance between the cathode and anode appropriate to ballistic electrons, when the latter are directed onto different points of the anode electrode by different gate biasing potentials.

DETAILED DESCRIPTION OF THE PREFERRED EMBODIMENTS

Figure 1:
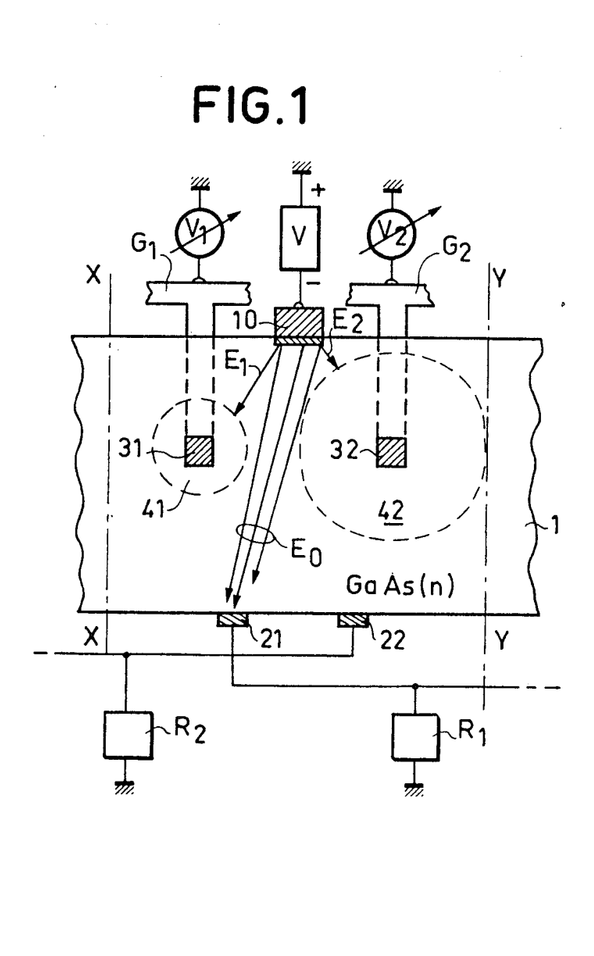
FIG. 1 is a first embodiment of the invention forming a switching device.

The switching device of FIG. 1 comprises a semiconductor material film 1 (in part section), said material being for example monocrystalline gallium arsenide, whose type n degree of doping is not critical and can be between $5.10^{15}$ and $10^{16}$ cm$^{-3}$ atoms of dopant. The thickness of film 1 is less than 1 micron which causes mechanical handling problems. It will be shown hereinafter that this film is the result of epitaxy on a substrate which is etched with a selective chemical agent after previously the epitaxial face on an insulating material support.

Film 1 possesses:

(a) a series of ohmic contacts on each of its large faces, namely source contacts 10 and target contacts 21 and 22, said contacts being represented by hatched areas in contact with the material of the film.

(b) A double row, (parallel to the ohmic contacts) of Schottky type contacts embedded in the body of film 1 (by a process to be described hereinafter), said contacts being interconnected outside the film by two gate bars $G_1$ and $G_2$.

It is accepted that the above contact assemblies form with the semiconductor material a series of cells XY defined by lines XX and YY on the section of FIG. 1. Each cell comprises a source contact 10, at least two drain or target contacts 21, 22 and two embedded gate contacts 31 and 32.

The source—drain spaces of the different cells are arranged in a parallel manner in order to obtain a total current which increases in proportion to the number of cells. To this end, contacts 10 are together connected to the same terminal, the negative pole of a voltage source V, whose positive pole is, for example, at a ground potential of the device. In the same way contacts 31 and 32 are respectively parallelled with gate bars on the negative poles of sources $V_1$ and $V_2$.

There are control means for voltages $V_1$ and $V_2$ to alternately make $V_1$ or $V_2$ greater than its neighbour (in absolute value), the two negative polarizations $V_1$ and $V_2$ being themselves higher than the negative polarization of source contact 10.

Finally, contacts 21 and 22 are connected to their corresponding contacts of adjacent cells and respectively connected in parallel to target devices $R_1$ $R_2$. It is possible to have three or four target contacts and three or four target devices.

The switching device operates in the following manner. It is considered that each cell is positioned between the lines XX and YY in FIG. 1. Due to the positive polarity of contacts 21 and 22 an electron beam is directed from source 10 at the target contacts 21 and 22. The orientation of the beam differs as a function of the bias on gate contacts 31 and 32.

First Case:

If, in absolute values, $V_2$ exceeds $V_1$, depleted areas 41 and 42 are created around contacts 31 and 32 as zones having unequal radii, the smallest radius being that of zone 41. The electron beam is divided up into three unequal parts. These consist of the largest part $E_o$, which is obliquely directed towards the face carrying the target contacts and, if the values of $V_1$ and $V_2$ are well chosen, is captured by target contact 21. These are ballistic electrons, due to the conditions initially fulfilled by the semiconductor film. For this reason, it is found that most of the electron beam is effectively captured by the target contact. The marginal parts $E_1$ and $E_2$ of the beam are not captured by the target contact 21, because they are subject to interference by the depleted zones. Therefore, virtually no electrons reach target contact 22.

Second Case:

If $V_2$, in absolute values, is smaller than $V_1$, the operation is identical, but target contact 22 receives most of the electron beam, whereas target contact 21 receives virtually none.

Thus, a current switching has taken place in favour of either target device $R_1$ or $R_2$.

The present switching device is brought about by the parallel arrangement of the different cells of film 1.

Among the major advantages of the switching device according to the invention, reference is made to those resulting from the solid state construction and those resulting from the speed characteristics of ballistics electrons.

Figure 2:
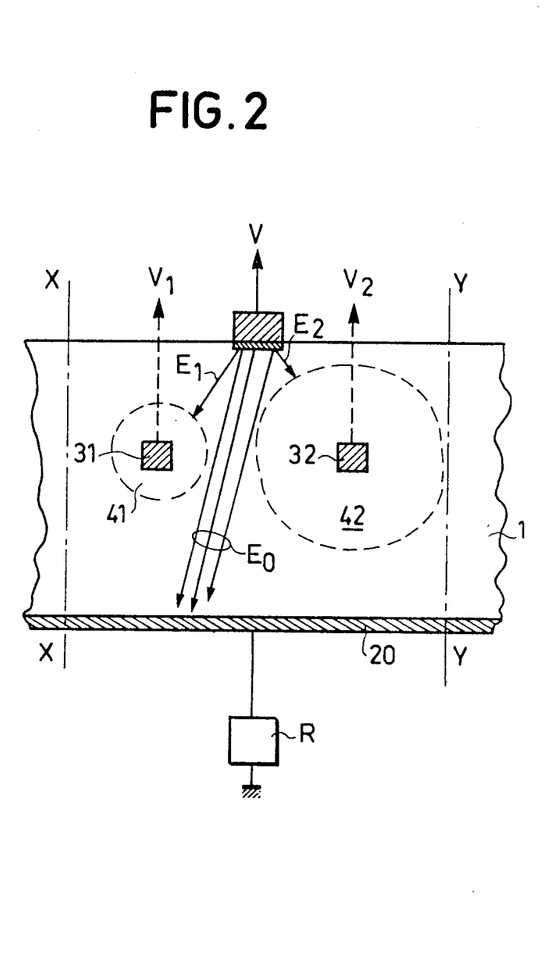
FIG. 2 is a second embodiment of the invention forming a phase shifter.

The phase shifter shown in FIG. 2 has a film 1 identical to that of the switching device of FIG. 1, except with regard to the target contacts. Thus, in the present case, a target contact 20 in the form of and represented as an ohmic contact, is deposited on the large face opposite to the source contacts. This single contact occupies a relatively large surface area, so that it is in all cases reached by the electron beam. This contact is connected to the input terminal of a target device R, whereof another terminal is connected to the ground of the phase shifter.

The operation is the same as for that of the switching device of FIG. 1 and most of the beam of electrons $E_o$ is directed obliquely towards a particular part of target 20, as a function of the ratio of the absolute values of voltages $V_1$ and $V_2$. Thus, there is a varying degree of phase shift of the signal reaching the target device R.

An example of the production process for a device according to the invention will be described hereinafter in the specific case of a two-position switch. The process is applicable, with minor changes, to switches having more than two positions and two phase shifters.

We start with an undoped, monocrystalline gallium arsenide substrate 3 (FIG. 3), but this could also be of arbitrary conductivity. This substrate has an arbitrary thickness and is intended to be eliminated during subsequent stages.

Figure 3:
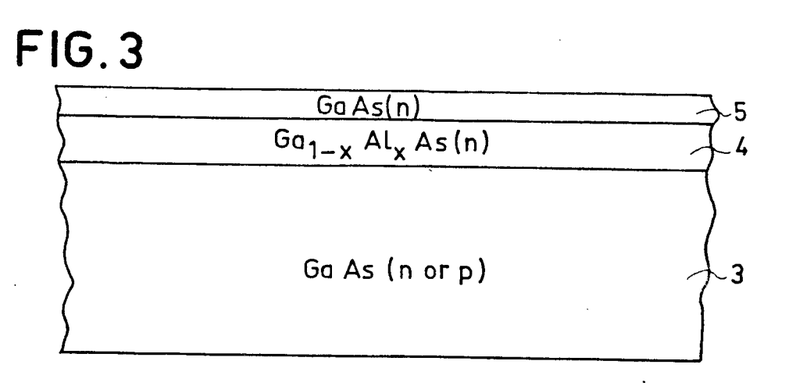
FIGS. 3 to 16 are different stages in the production of a device according to the invention.

For example, by using the organo-metallic epitaxy method, an epitaxial layer 4 is formed on substrate 3, said layer being of composition in which x is between 0 and 1, but whose value must be large enough to permit selective chemical etching by an agent which spares GaAs. Its thickness is, for example, approximately 1 micron.

A gallium arsenide layer 5 with an uncritical, type n doping level of $5.10^{15}$ to $10^{16}$ cm$^{-3}$ atoms is grown by epitaxy on layer 4. The thickness is, for example, approximately 1/10 micron.

Figure 4:
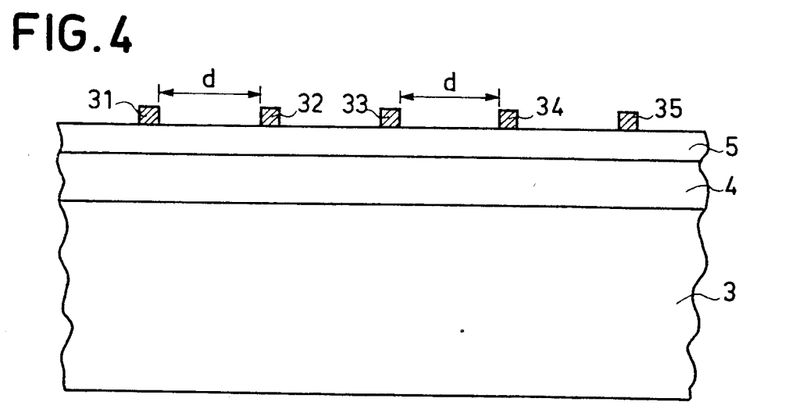
Figure 5:
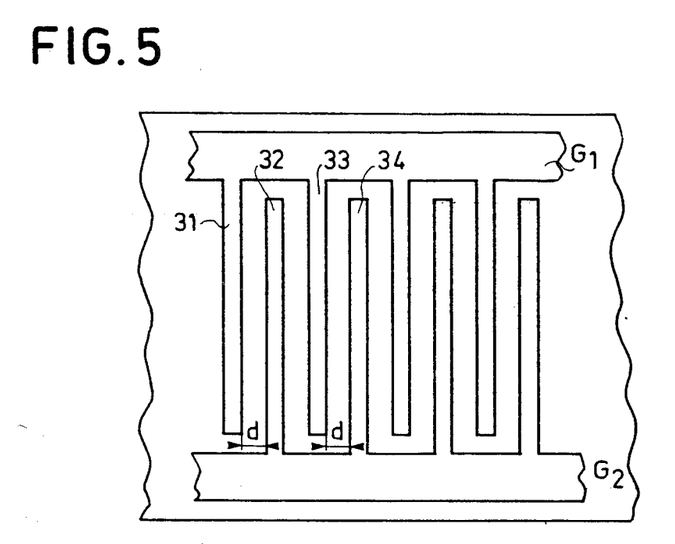

FIGS. 4 and 5 respectively show in section and plan view, the result of a metal deposition stage on layer 5 in such a way as to form two interdigitated gates. Gate $G_1$ has fingers 31, 33, etc perpendicular to the sectional plane of FIG. 4. Gate $G_2$ has fingers 32, 34, etc parallel to fingers 31, 33. The distance d between fingers 31 and 32 (or between 33 and 34) is fixed to a predetermined value as a function of FIG. 1, while the distance between fingers 32 and 33 or the like can differ.

Figure 6:
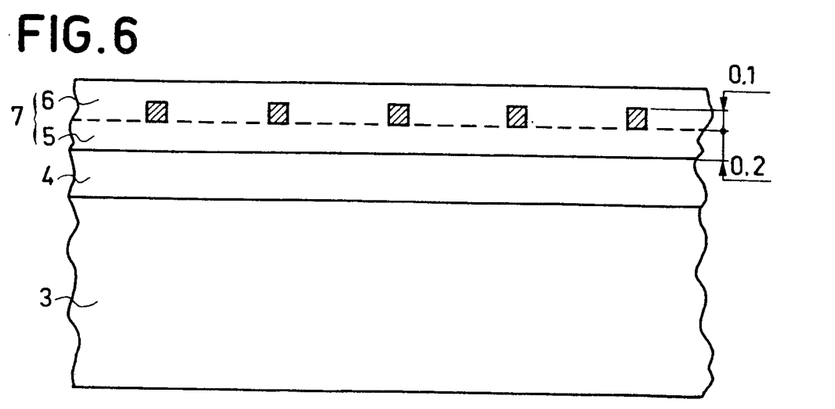
Figure 7:
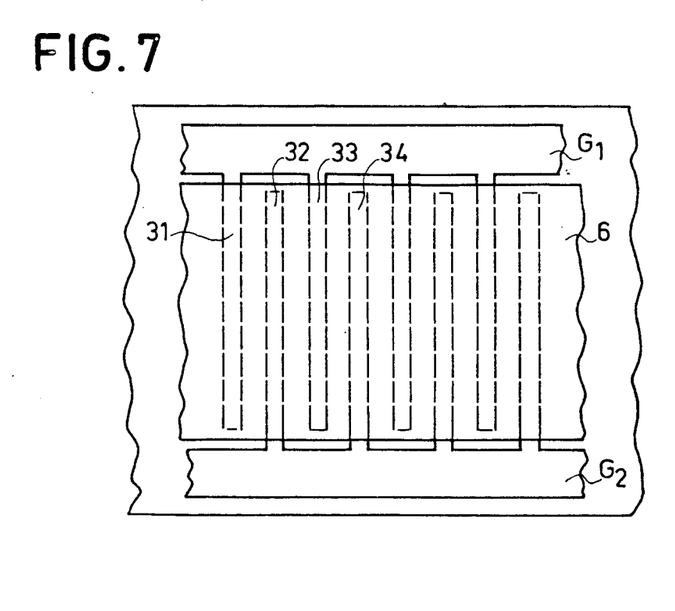

FIGS. 6 and 7 respectively show in section and plan view the result of a stage in which, by epitaxy, a gallium arsenide layer 6 is grown in such a way as to embed the fingers of the two gates $G_1$ and $G_2$. The width of coating 6 is limited in such a way that access is obtained to the gate bars in order to connect them to the bias voltage sources.

The gallium arsenide of layer 6 is doped identically to that of layer 5 giving in practice a single coating 7 in which are embedded the fingers of the two grids $G_1$ and $G_2$.

Figure 8:
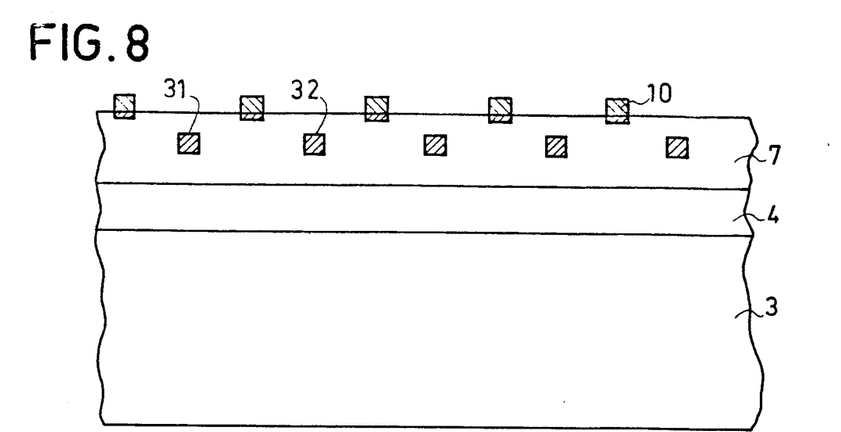

FIG. 8 shows in section the result of a stage in which source contacts 10 in the form of fingers parallel to the gate fingers 31 and 32 have been deposited, but care has been taken to ensure that each contact 10 is equidistant from each of the fingers 31 and 32. The dimensions of the rows of fingers are e.g. length 200 micron, width 0.1 micron, thickness 0.1 micron (which fixes the "length" of the transistor gate), spacing between two adjacent gate fingers 0.5 micron and spacing between two source contacts 1 micron. The thickness of layer 7 is 0.2 to 0.3 micron.

Figure 9:
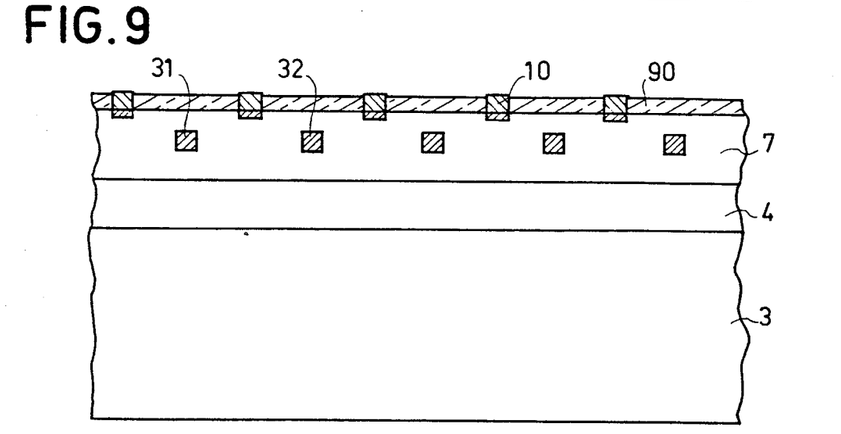

FIG. 9 shows the result of a stage in which an insulator 90 has been deposited between source contacts 10. To this end, the upper part of contacts 10 has been previously protected by selectively depositing resin fingers on contacts 10 using photolithographic processes. This intermediate stage is not shown. Silicon dioxide ($SiO_2$) is then deposited on the complete device and the resin fingers and the silicon dioxide covering them are removed as a result of the action of a resin solvent.

Figure 10:
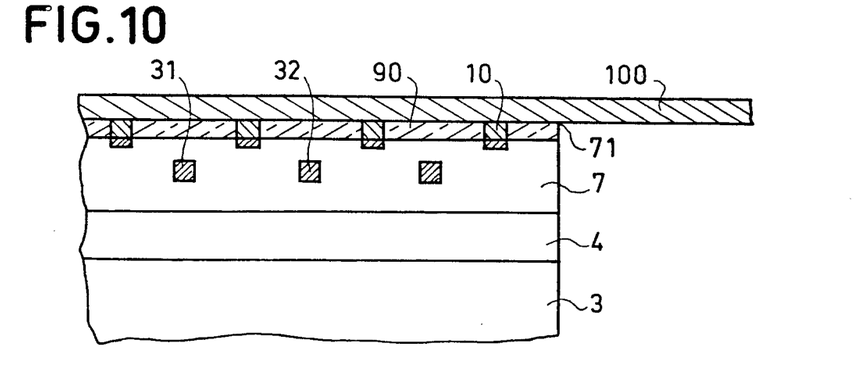

FIG. 10 shows the result of a stage in which there has been deposited a metal plate 100, which is relatively much thicker than semiconductor coatings 4 and 7, whereof the scale has been especially increased. Plate 100 serves to give access, in parallel, to source contacts 10. It projects beyond the semiconductor block along one edge 71 of the latter.

The two following stages consist of eliminating the semiconductor substrate and substituting for it an insulating support on the side of plate 100.

Figure 11:
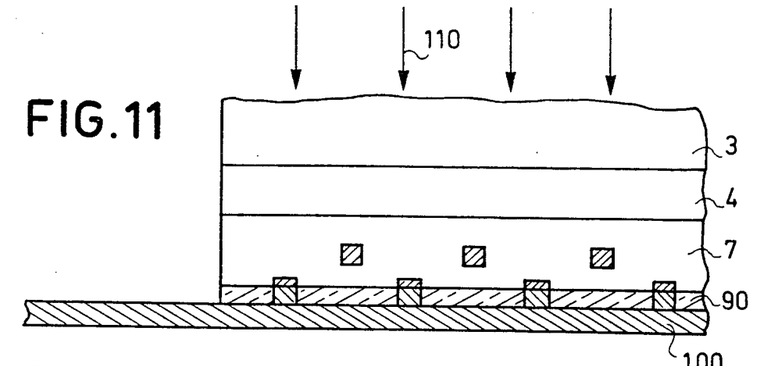

FIG. 11 shows an intermediate substage of the elimination of the semiconductor block during which:

(a) in a first substage shown in FIG. 11, the gallium arsenide substrate is etched (arrows 110) with a selective chemical agent, e.g. a mixture of 19 volumes of hydrogen peroxide and 1 volume of ammonia;

(b) in a second substage after completely eliminating the gallium arsenide of the substrate, the gallium arsenide and aluminium of coating 4 are etched with a selective chemical agent, e.g. a mixture of hydrofluoric acid and pure water in equal volumes. Chemical etching is continued until the GaAlAs is completely eliminated.

Figure 12:
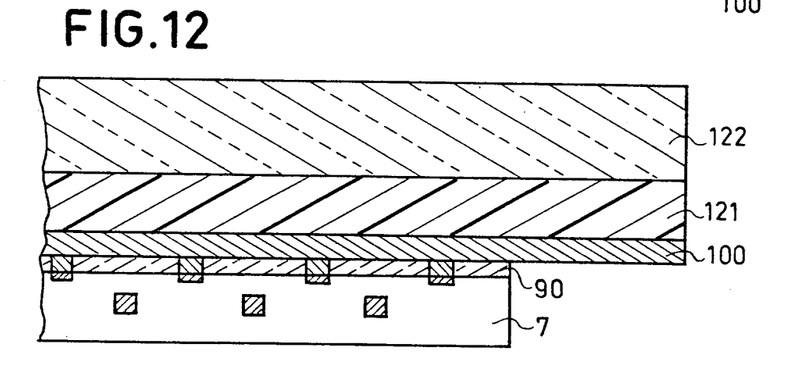

FIG. 12 shows the result of a stage in which an epoxy resin coating 121 and a relatively thick glass coating 122 to permit easy handling of the device have been successively deposited on plate 100.

The following stages consist of making several rows of anodic contacts or targets with fingers parallel to the fingers of gates $G_1$ and $G_2$ (Schottky contacts 31 and 32).

In a first stage, a first row of fingers—like target contacts 21 is deposited.

Figure 13:
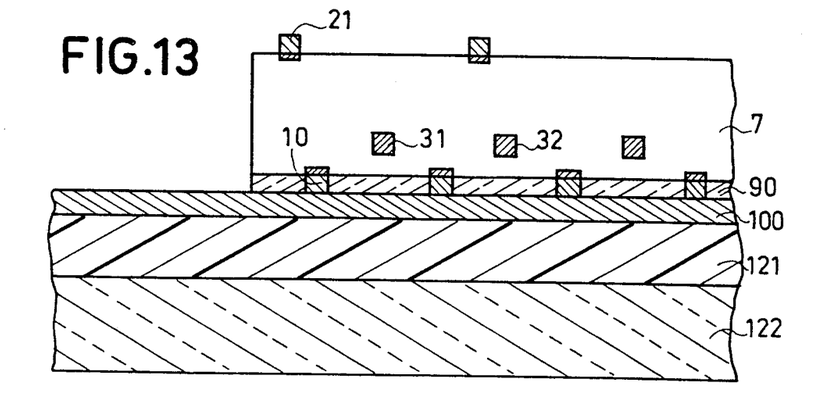
Figure 15:
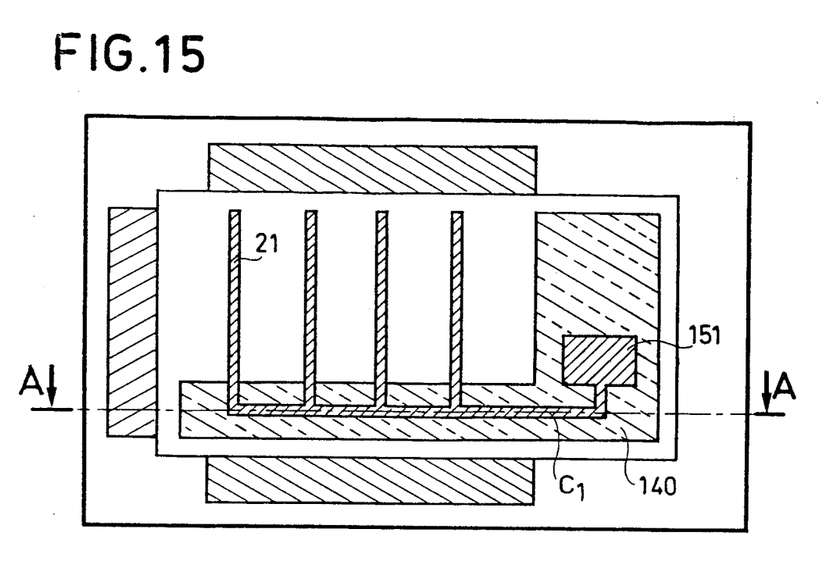

(a) By photolithography, a photosensitive resin mask is formed and this is exposed in accordance with the pattern of contacts 21 constituting parallel fingers branched on a common strip $C_1$ (first row of targets), as can be seen in FIG. 15. To form the latent image of strip $C_1$ on the resin mask, optical means are employed and these are accurately aligned with the row of gates 31, 32. Thus, in each cell and in the sense defined hereinbefore, the respective positions of the gates and anodes relative to the cathodes must be strictly respected, as well as the parallelism of the different electrodes. An infrared light microscope (wavelength about 0.9 micron) is used for rendering these fingers visible by transparency through the gallium arsenide. After developing the resin mask, depositing metal in the thus revealed grooves and finally eliminating the remaining resin, the results visible in section in FIG. 13 are obtained.

Figure 14:
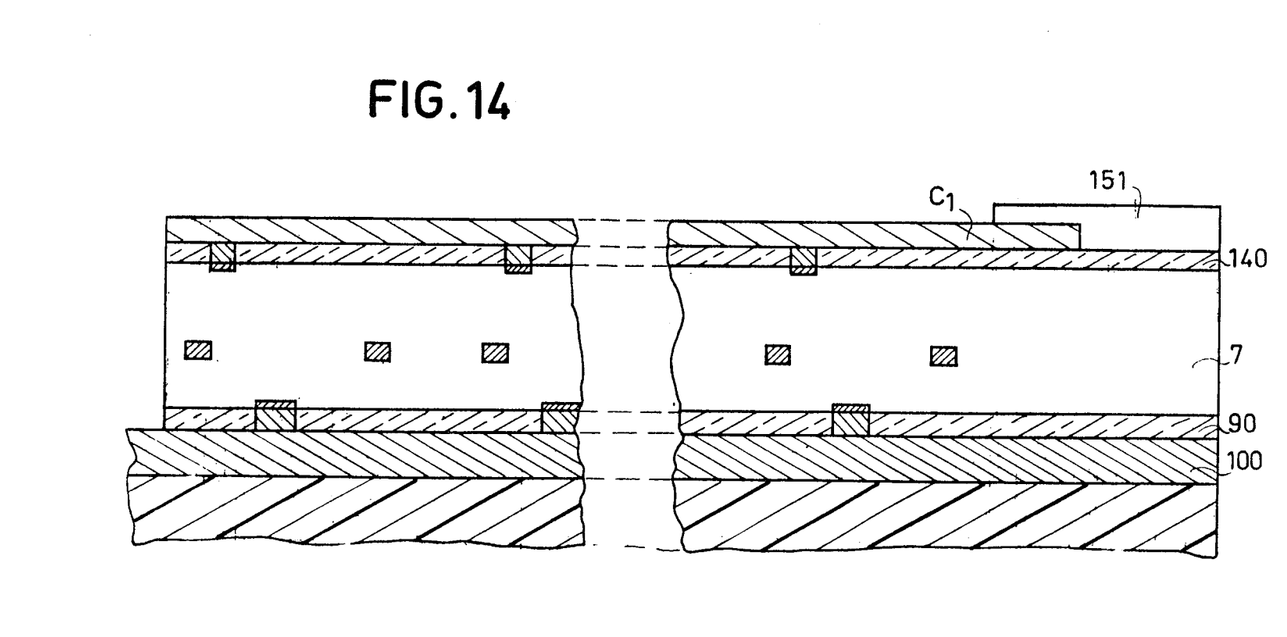

(b) In FIGS. 14 and 15 are shown in section and plan view, the result of substages in which:

(1) An insulator 140 has been deposited between target contacts 21 and at the location of strip $C_1$ joining contacts 21.

Figure 16:
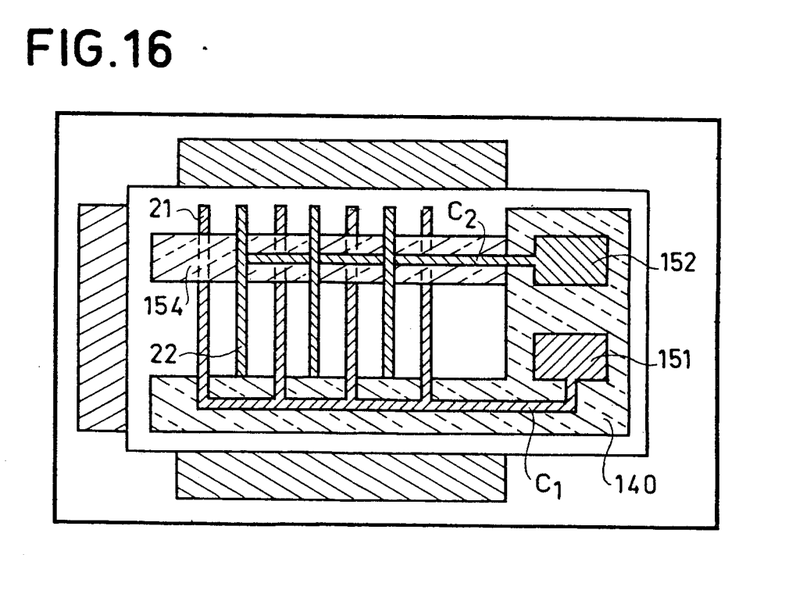

(2) Deposited on insulator 140 is the metal strip $C_1$ and a connector 151 connected to strip $C_1$. In a second stage, operations identical to those of the preceding stage are performed. However, the silicon dioxide deposits are made in such a way as to insulate the metal strips (to be deposited) of the second row of contacts and the metal strips (already deposited) of the first row of contacts. Thus, the device of FIG. 16 is obtained in the case of limiting to two rows of contacts 21, 22. It is pointed out that:

(1) The metal strip $C_2$ joining target contacts 22 of the first row is deposited on an insulating layer 154 covering the first row of contacts 21.

(2) This strip 152 is connected to a connector $C_3$ deposited on insulating layer 154.

In the case of switching with three or more targets, the spacing of the row of finger contacts of each target remains equal to the distance separating two consecutive source contacts, i.e. 1 micron in the aforementioned example, the distance between the targets being less than 1 micron.

The production process for a phase shifter according to the invention includes the same stages as described hereinbefore, with the exception of the final stages relating to the deposition of anodic contacts. These stages are replaced by a single stage during which there is a metal deposit on coating 7 (FIG. 12) for forming the target electrode 20 as shown in FIG. 2.

What is claimed is:

1. An electron deflection device of the ballistic transport type, comprising:
   a semiconductor chip;
   at least one cathode electrode located on one side of said chip and at least one anode electrode located on the opposite side of said semiconductor chip;
   said anode and said cathode electrodes forming ohmic contacts with said chip;
   said chip including a first buried electrode forming a first Schottky contact and a second buried electrode forming a second Schottky contact;
   means for applying polarization voltages to the first and the second buried electrodes in such a manner that an electron beam propagated between the anode and the cathode electrodes in response to a voltage applied between said anode and said cathode electrodes is deflected as a function of the potential difference between said first and said second buried electrodes; and including at least one supplementary anode electrode arranged in such a way that said electron beam passes through a selected one of the anode electrodes on modifying by a given quantity the ratio of the voltages respectively applied to the first and the second buried electrodes; wherein the cathode electrode, first and second buried electrodes and anode electrodes form rows of parallel electrodes, the first and second buried electrodes forming an interdigitated grid.

2. An electron deflection device of the ballistic transport type, comprising:
   a semiconductor chip;
   at least one cathode electrode located on one side of said chip and at least one anode electrode located on the opposite side of said semiconductor chip;
   said anode and said cathode electrodes forming ohmic contacts with said chip;
   said chip including a first buried electrode forming a first Schottky contact and a second buried electrode forming a second Schottky contact;
   means for applying polarization voltages to the first and the second buried electrodes in such a manner that an electron beam propagated between the anode and the cathode electrodes in response to a voltage applied between said anode and said cathode electrodes is deflected as a function of the potential difference between said first and said second buried electrodes; wherein the anode electrode has an adequate length to a give a transit time difference between the cathode and the anode electrodes for the electrons of said electron beam, when the electrons are directed onto different points of the anode electrode due to different potentials of said first and said second buried electrodes; and wherein the cathode electrode and first and second buried electrodes form rows of parallel electrodes, the buried electrodes being two interdigitated sets.

3. A device according to any one of claims 1 or 2, wherein the semiconductor chip is made from gallium arsenide doped with between $5.10^{15}$ and $10^{16}$ cm$^{-3}$ atoms of type n dopant, the thickness of the chip being less than 1 micron thickness.

* * * * *